United States Patent
Esser et al.

(10) Patent No.: US 7,979,818 B1
(45) Date of Patent: Jul. 12, 2011

(54) PACKET PROCESSING VALIDATION

(75) Inventors: Robert Peter Esser, Los Gatos, CA (US); Juan Jose Noguerra Serra, Dublin (IE)

(73) Assignee: Xilinx, Inc., San Jose, CA (US)

( * ) Notice: Subject to any disclaimer, the term of this patent is extended or adjusted under 35 U.S.C. 154(b) by 350 days.

(21) Appl. No.: 12/340,130

(22) Filed: Dec. 19, 2008

(51) Int. Cl.
 *G06F 17/50* (2006.01)
(52) U.S. Cl. ......... 716/104; 716/103; 716/106; 716/111
(58) Field of Classification Search .................. 716/104, 716/103, 106, 111
 See application file for complete search history.

(56) References Cited

U.S. PATENT DOCUMENTS

| | | | |
|---|---|---|---|
| 7,165,100 B2 * | 1/2007 | Cranor et al. ................. | 709/223 |
| 7,636,908 B1 * | 12/2009 | Brebner ........................ | 716/102 |
| 2007/0211697 A1 * | 9/2007 | Noble ........................... | 370/352 |
| 2008/0270103 A1 * | 10/2008 | Kaszynski et al. .............. | 703/22 |

OTHER PUBLICATIONS

U.S. Appl. No. 11/799,897, filed May 3, 2007, Brebner et al.
U.S. Appl. No. 11/799,860, filed May 3, 2007, Keller et al.
U.S. Appl. No. 11/799,953, filed May 3, 2007, James-Roxby al.
U.S. Appl. No. 11/799,966, filed May 3, 2007, Keller et al.
U.S. Appl. No. 11/799,898, filed May 3, 2007, Keller et al.
U.S. Appl. No. 11/818,788, filed Jun. 14, 2007, Attig et al.
U.S. Appl. No. 11/818,811, filed Jun. 14, 2007, Attig et al.
U.S. Appl. No. 11/818,792, filed Jun. 14, 2007, Brebne.
U.S. Appl. No. 11/818,722, filed Jun. 14, 2007, Brebner et al.

* cited by examiner

*Primary Examiner* — Paul Dinh
*Assistant Examiner* — Brian Ngo
(74) *Attorney, Agent, or Firm* — LeRoy D. Maunu

(57) ABSTRACT

Approaches for validating a design for a packet processing circuit. A method inputs a high-level language specification of a first format of an input packet. From the input specification, a plurality of high-level input packets having the first format are generated, with each field of each input packet having a value consistent with the packet specification. The packet processing circuit is simulated using a first model with input of the high-level input packets, and a first plurality of high-level output packets are output. The high-level input packets are translated into low-level input packets. The packet processing circuit is simulated using a second model with input of the low-level input packets, and a plurality of low-level output packets are output and translated into a second plurality of high-level output packets. The first and second pluralities of high-level output packets are compared to corresponding expected output packets, and comparison results stored.

20 Claims, 4 Drawing Sheets

PACKET PROCESSING VALIDATION

FIELD OF THE INVENTION

The present invention generally relates to the validation of circuit designs that process packets of a communications protocol.

BACKGROUND

Many communication protocols use packets to convey data and control information through the various devices in a communication network. The data in a packet is typically formatted into fields for control information and payload data. At the implementation level, packets are manipulated as a sequence of binary data. At a higher level of abstraction, packets can be regarded as instances of a structured data type whose components represent static, optional, or alternative fields of the packets. Layers of the communication protocol are based on a packet specification to extract and/or provide necessary information in the packets.

In testing a design for a device that is built for a particular communication protocol, the effort generally involves preparing and inputting packets to the design, capturing packets that are output from the design, and determining whether or not the output packets are correct. The process of generating a suitable set of input packets for testing a design may be time consuming. Not only is it a challenge to prepare a suitable testbench of packets, but the binary representation of packets for low-level testing makes it challenging for a tester to correlate the binary packet data with a high-level representation of what is being tested. In addition, test coverage may be compromised due to the effort involved in constructing and executing tests. The lack of sufficient test coverage may leave parts of a system untested, which may increase the risk of design errors going undetected and being carried through to a production system.

The present invention may address one or more of the above issues.

SUMMARY

The various embodiments of the invention provide approaches for validating a design for a packet processing circuit. In one embodiment, a method inputs from a memory to a processor, a high-level language specification of a first format of an input packet. The specification defines a plurality of fields of the input packet and a respective set of one or more possible values for each of the fields. The processor generates a plurality of high-level input packets having the first format. Each field of each input packet has a value from the respective set. The circuit is simulated using a first model of the design on the processor. The first model inputs the high-level input packets and outputs a first plurality of high-level output packets. The processor translates the high-level input packets into a plurality of low-level input packets. The circuit is simulated using a second model that inputs the low-level input packets and outputs a plurality of low-level output packets. The processor translates the low-level output packets into a second plurality of high-level output packets. The first plurality of high-level output packets is compared to corresponding expected output packets, and the second plurality of high-level output packets is compared to the corresponding expected output packets. The processor stores data indicative of results of the comparison.

In another embodiment, a system comprises a processor and a memory coupled to the processor. The memory is configured with instructions that when executed by the processor cause the processor to perform operations including inputting a high-level language specification of a first format of an input packet. The specification defines a plurality of fields of the input packet and a respective set of one or more possible values for each of the fields. The operations include generating from the input specification a plurality of high-level input packets having the first format. Each field of each input packet has a value from the respective set. The circuit is simulated using a first model of the design. The first model inputs the high-level input packets and outputs a first plurality of high-level output packets. The high-level input packets are translated into a plurality of low-level input packets, and the circuit is simulated using a second model that inputs the low-level input packets and outputs a plurality of low-level output packets. The operations further include translating the low-level output packets into a second plurality of high-level output packets, comparing the first plurality of high-level output packets to corresponding expected output packets, and comparing the second plurality of high-level output packets to the corresponding expected output packets. The processor stores data indicative of results of the comparisons.

An article of manufacture is provided in another embodiment. The article of manufacture comprises a processor-readable storage medium configured with instructions for validating a design for a packet processing circuit. The instructions, when executed by one or more processors, cause the processor to perform the operations including inputting a high-level language specification of a first format of an input packet. The specification defines a plurality of fields of the input packet and a respective set of one or more possible values for each of the fields. The operations include generating from the input specification a plurality of high-level input packets having the first format. Each field of each input packet has a value from the respective set. Further operations include simulating the circuit using a first model of the design. The first model inputs the high-level input packets and outputs a first plurality of high-level output packets. The high-level input packets are translated into a plurality of low-level input packets, and the circuit is simulated using a second model that inputs the low-level input packets and outputs a plurality of low-level output packets. The operations include translating the low-level output packets into a second plurality of high-level output packets, comparing the first plurality of high-level output packets to corresponding expected output packets, and comparing the second plurality of high-level output packets to the corresponding expected output packets. Data indicative of results of the comparing operations are then stored.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

Figure 1:
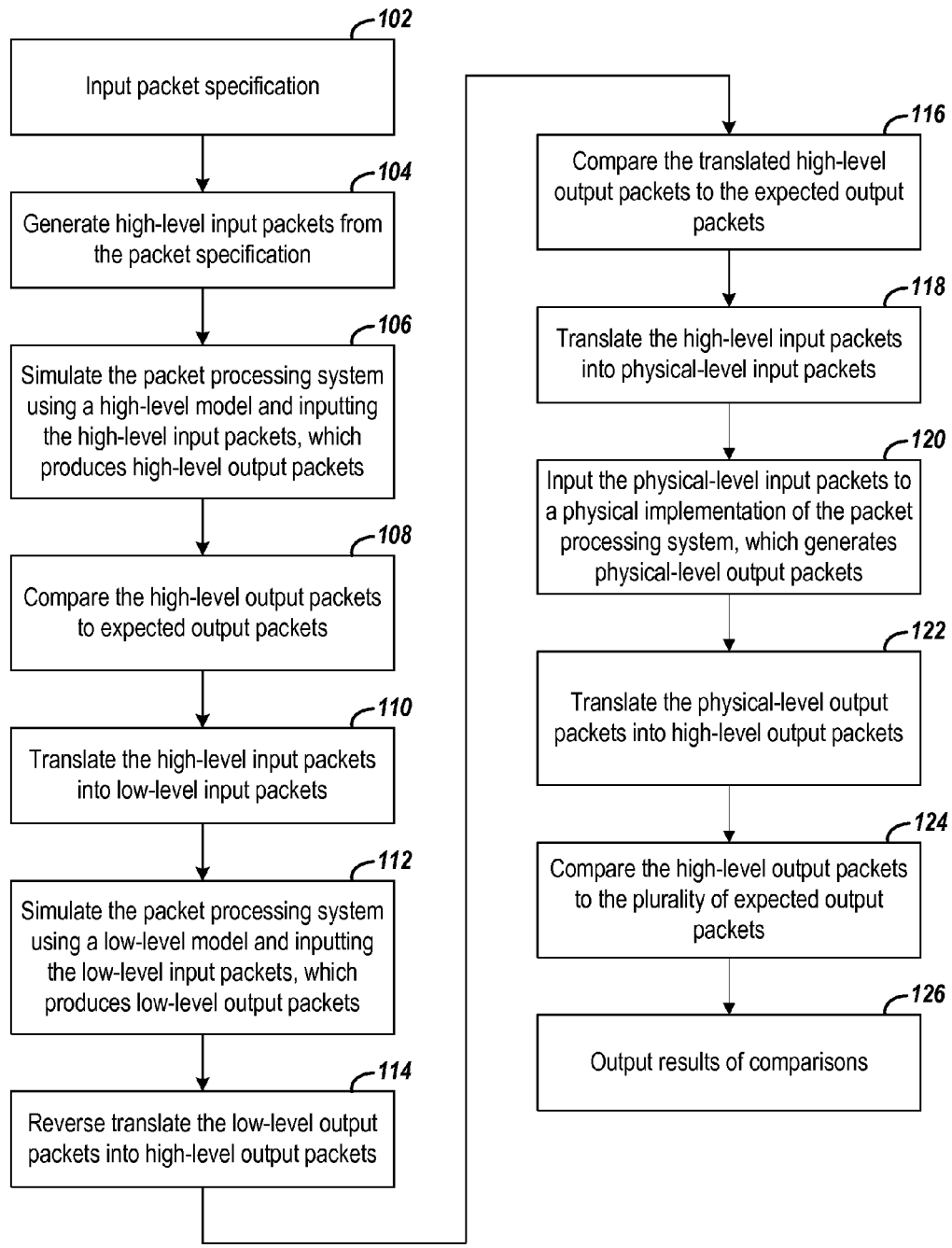
FIG. 1 is a flow diagram of a method of validating a circuit for processing packets of a communication protocol, in accordance with various embodiments of the invention.

FIG. 1 is a flow diagram of a method of validating a circuit for processing packets of a communication protocol in accordance with various embodiments of the invention. A specification of a plurality of fields of a first format of the communication protocol and of a respective set of one or more possible values for each of the fields is input at step 102. A high-level language approach is used to define packet formats and content, and from the high-level language specification sets of packets are generated for use as a test bench for validation and analysis purposes. A high-level test bench provides the input to user-level validation/analysis of packet processing functions. From the high-level test bench, lower-level test benches are also created for use as input to software and hardware implementation level network processing functions. Thus, a single, high-level test bench can be used for analysis and validation at differing abstraction levels. The ability to not only transform to lower abstraction levels, but also from lower to higher levels, allows test results to be easily understood by users and automated tools.

Rather than defining a packet as a sequence of bits and explicitly defining fields by index ranges within the sequence, packets can be represented via a high-level language, as shown in Example 1 below:

formatvalue example1=(
'a' : char,
0 : nat,
true : boolean,
0b1111 : bit [4]);

Example 1

The example1 format specifies a single packet consisting of four fields of four different types, with a discrete value being defined for each field. An extension of this language allows field values to be specified using wildcard characters, don't-care characters, lists of discrete values, and ranges. A wildcard character, for example, "*", signifies all possible values of that type. A don't-care character, for example, "?", signifies a single random value of that type. A list of discrete values may be combined with a range specification, for example, [0|2|3 . . . 5].

Example 2 below shows a second example packet definition:

formatvalue example2=(
'a' : char,
0 : nat,
* : boolean,
0b1110 . . . 0b1111 : bit[4]);

Example 2

The example2 packet specification sets forth that a packet conforming to the definition will have the "a" character, followed by the integer 0, followed by a Boolean value true or false, followed by a 4-bit value of either 0b1110 or 0b1111.

According to step 104 of the process of FIG. 1, a plurality of high-level input packets are generated according to the defined format set forth in the input packet specification. The fields of the generated high-level input packets have values based on the field definitions in the packet specification. The high-level packets in Example 3 below are those that result from the specification in Example 2.

formatvalue example2a=(
'a' : char,
0 : nat,
true : boolean,
0b110 : bit[4]);
formatvalue example2b=(
'a' : char,
0 : nat,
false : boolean,
0b1110 : bit[4]);
formatvalue example2c=(
'a' : char,
0 : nat,
true : boolean,
0b1111 : bit[4]);
formatvalue example2d=(
'a' : char,
0 : nat,
false : boolean,
0b1111 : bit[4]);

Example 3

In generating high-level input packets from a specification that includes a wildcard ("*") specification for a field, packets are generated with all possible values for that field. Where a don't-care ("?") is specified for a field, a packet containing a random (technically, pseudo-random) value for that field is generated.

A packet specification may specify a field as having alternative values. The packet specification in Example 4 below illustrates such a field.

formatvalue example3=(
'a' : char,
0 : nat,
true : boolean, {
  0b1111 : bit[4]
|
  0x0f0 : bit[12]
);

Example 4

The last field in the packet of Example 4 is either a 4-bit field having the value 0b1111 or a 12-bit field having the value 0x0f0. Example 5 below shows the high-level packet instances generated from the packet specification of Example 4.

formatvalue example3a=(
'a' : char,
0 : nat,
true : boolean,
{
  0b1111 : bit[4]
|
  -
);
formatvalue example3b=(
'a' : char,
0 : nat,
true : boolean,
{
  -
|
  0x0f0 : bit [12]
);

Example 5

The inclusion of the alternative syntax in the concrete representation, "-" indicating the unused alternative, can be used to indicate that packets can have a different shape. This mechanism is typically used to represent optional packet encapsulation. For example, an IP packet might encapsulate TCP or UDP packets.

After generating the plurality of high-level input packets from the specification, the packet processing system (i.e., the circuit) is simulated at step 106. The simulation uses a first model that inputs the high-level input packets and outputs high-level output packets according to the format for output packets of the communication protocol. This high-level representation of packets can be used by tools that process and display packets in a human readable way.

At step 108, the process compares the high-level output packets to expected output packets having the output format to determine if they are equivalent. The content of the expected output packets depends on the particular communications protocol and the content of the high-level input packet. The expected output packets can be either created manually by a developer or may be validated results from an initial high-level simulation, which can then be used as the expected packets in a regression testing flow.

In determining whether or not two packets are equivalent, it will be appreciated that in some applications it is useful for two packets to be recognized as equivalent even though they are not exactly the same. For example, different text may be used to represent the same information, such as different representations of whitespace. Another example is where two high-level packet representations have different, but compatible data types representing the same information, such as bit[8] and char or bit[1] and Boolean.

According to a further embodiment of the invention, the high-level input packets are translated, in step 110, into corresponding low-level input packets. The low-level packets may be a bit-level representation to be used as input to a Register Transfer Level RTL-level simulation. At step 112, the packet processing system is simulated at the RTL level using an RTL model (e.g., VHDL or Verilog). The RTL model inputs the low-level input packets and produces low-level output packets. The plurality of low-level output packets are then reverse translated into a second set of high-level output packets at step 114. The reverse translation takes the bit-level representation of the low-level output packets to a high-level structured representation. The high-level output packets of the second set are compared to the expected output packets in step 116 to determine equivalency.

In another embodiment, the high-level input packets are translated at step 118 into physical-level input packets that can be used to validate a physical implementation of the packet processing circuit design. At step 120 the physical-level input packets are input to the physical implementation, which generates physical-level output packets. The physical-level output packets are then reverse translated into a third set of high-level output packets at step 122. At step 124, the high-level output packets of the third set are compared to the expected output packets to determine equivalency. The results of the comparisons from steps 108, 116 and 124 are output in step 126.

Figure 2:
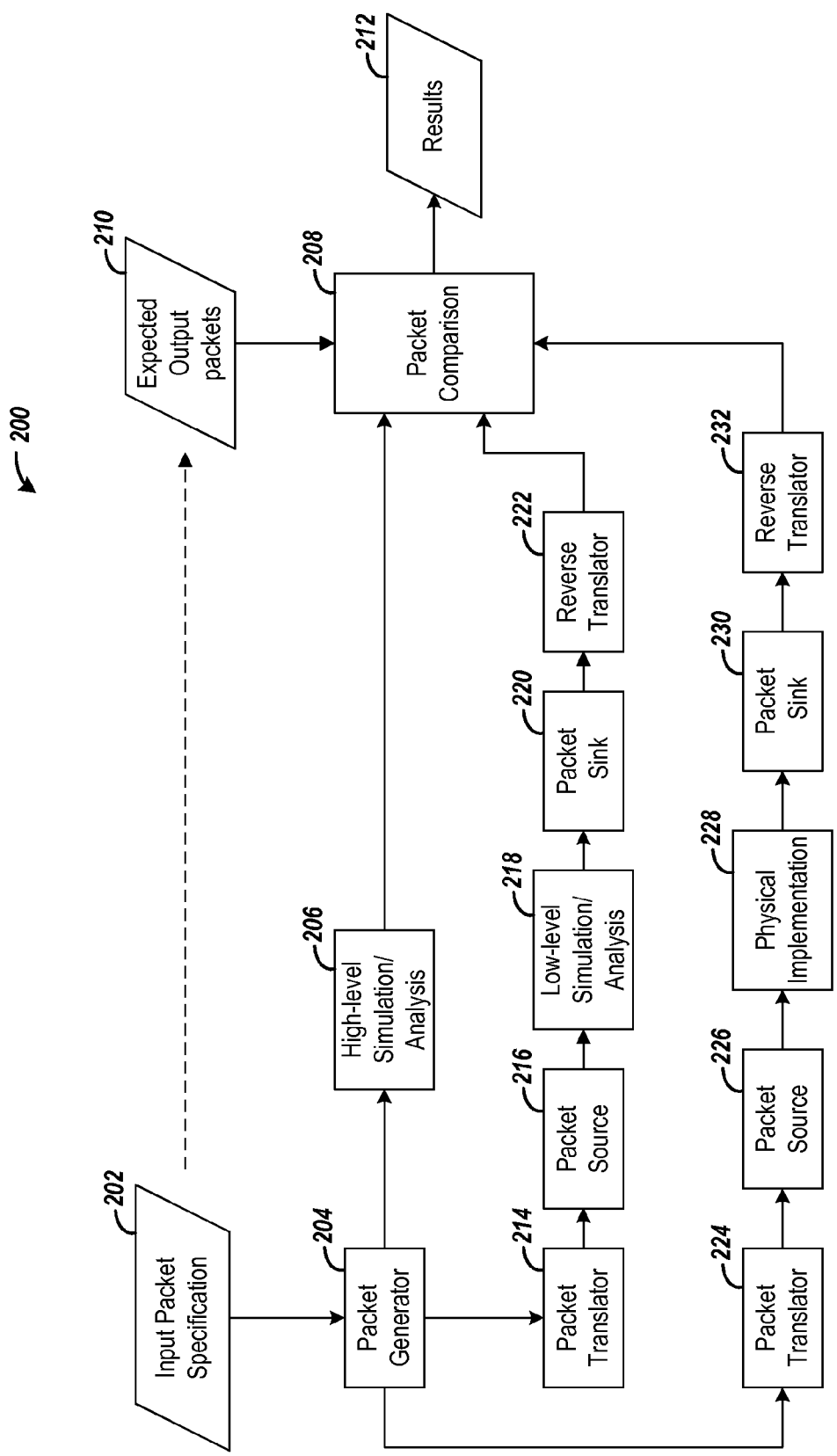
FIG. 2 is a system for validating a circuit for processing packets of a communication protocol, in accordance with various embodiments of the invention.

FIG. 2 is a block diagram of an example system 200 for validating a design for a packet processing circuit in accordance with various embodiments of the invention. An input packet specification 202 is provided as input to packet generator 204. The input packet specification includes one or more packet definitions, with each packet definition defining data types and possible data values for the fields of the packet. The packet generator 204 generates a plurality of high-level input packets from the specification, with each field of each high-level input packet having a value consistent with the field definition. Example 6 below shows a basic packet specification and the generated high-level input packets.

Packet specification:
formatvalue ExamplePacket=(
  [0 . . . 3] : 4)
)
Generated high-level input packets:
formatvalue ExamplePacket_0=(
  0 : 4
);
formatvalue ExamplePacket_1=(
  1 : 4
);
formatvalue ExamplePacket_2=(
  2 : 4
); and
formatvalue ExamplePacket_3=(
  3 : 4
)

Example 6

System 200 provides three different validation paths. The first validation path provides a high-level validation where the high-level input packets are input to a high-level simulation/analysis tool 206 that simulates the packet processing system. The high-level simulation/analysis tool 206 simulates the packet processing at the functional level and produces a first plurality of high-level output packets responsive to the input of the plurality of high-level input packets. For example, in response to high-level input packet ExamplePacket_0 (Example 6), the high-level simulation/analysis tool 206 produces the following high-level output packet:
formatvalue ExamplePacket_0=(
  0xFFFF : 16
)
In the example, the high-level simulation/analysis tool 206 produces a separate high-level output packet for each of the other high-level input packets ExamplePacket_1, ExamplePacket_2, and ExamplePacket_3. Note that different packet protocols may not produce any output packet in response to a particular input packet or may produce multiple output packets in response to a single input packet. Those skilled in the art will recognize various simulation tools that may be used for the functional simulation described for simulation block 206. For example, an explicit software representation (C, Java, Perl, etc.) that accepts and produces high-level packets may be used, or a network simulator may be used.

The packet comparison module 208 compares the high-level output packets to corresponding expected output packets 210 to determine if the packets are equivalent. The results 212 of the comparison are output by the packet comparison module 208. The comparison results may show packet-by-packet differences in data values as well as simple pass-file indicators.

The second validation path provides low-level validation (e.g., RTL simulation) of a packet processing circuit. The high-level input packets, as generated by packet generator 204, are translated into corresponding low-level input packets by packet translator 214. For example, for the high-level input packet ExamplePacket_0 (Example 6), the packet translator 214 produces the following low-level input packet:

D 0x0:4 # bit[4]

A separate low-level input packet is also produced by packet translator 214 for each of the other high-level input packets ExamplePacket_1, ExamplePacket_2, and ExamplePacket_3 (shown above). The low-level input packets are input by packet source 216 to low-level simulation/analysis tool 218. The packet source 216 is not part of the simulated packet processing circuit, but supports the simulation by providing the input packets to the input port(s) of a simulated packet processing circuit.

Based on a low-level simulation model and the low-level input packets, the low-level simulation/analysis tool 218 produces corresponding low-level output packets. For example, in response to the low-level input packet for ExamplePacket_1, the low-level simulation/analysis tool 218 produces the following low-level output packet:

D 0xFFFF:16 # bit[16]

The packet sink 220 is not part of the simulated packet processing circuit, but supports the simulation by receiving and collecting the output packets from the output port(s) of the simulated packet processing circuit.

Reverse translator 222 reverse translates the low-level input packets into a set of corresponding high-level output packets, which are provided to the packet comparison module 208. The packet comparison module 208 determines if the set of corresponding high-level output packets is equivalent to the expected output packets 210. The results 212 of the comparison are also output by the packet comparison module.

The third validation path is a physical-level validation. Packet translator 224 translates the high-level input packets into physical-level input packets for input to a physical implementation 228 of the packet processing circuit design. The following physical-level input packet may be produced from the high-level input packet ExamplePacket_0 (Example 6) where each "0" corresponds to a binary digit

0000

A separate physical-level input packet is also produced by packet translator 224 for each of the other high-level input packets ExamplePacket_1, ExamplePacket_2, and ExamplePacket_3.

The physical-level input packets are input by packet source 226 to a physical implementation 228 of the packet processing circuit undergoing validation. The packet source 226 is not part of the packet processing circuit undergoing validation, but supports the validation by providing the input packets to the input port(s) of the packet processing circuit.

The physical implementation 228 produces physical-level output packets in response to the input physical-level input packets. For example, in response to the physical-level input packet shown above (0000), the physical implementation 228 outputs the following physical-level output packet (16 binary digits):

1111111111111111

The packet sink 230 is not part of the implemented packet processing circuit, but supports the validation by receiving and collecting the output packets from the output port(s) of implemented packet processing circuit 228. The physical-level input packets are translated by reverse translator 232 into another set of high-level output packets. This set of high-level output packets is compared by the packet comparison module 208 to the corresponding expected output packets 210 to determine whether or not the packets are equivalent. The results 212 of this comparison are also output by the packet comparator 208.

Figure 3:
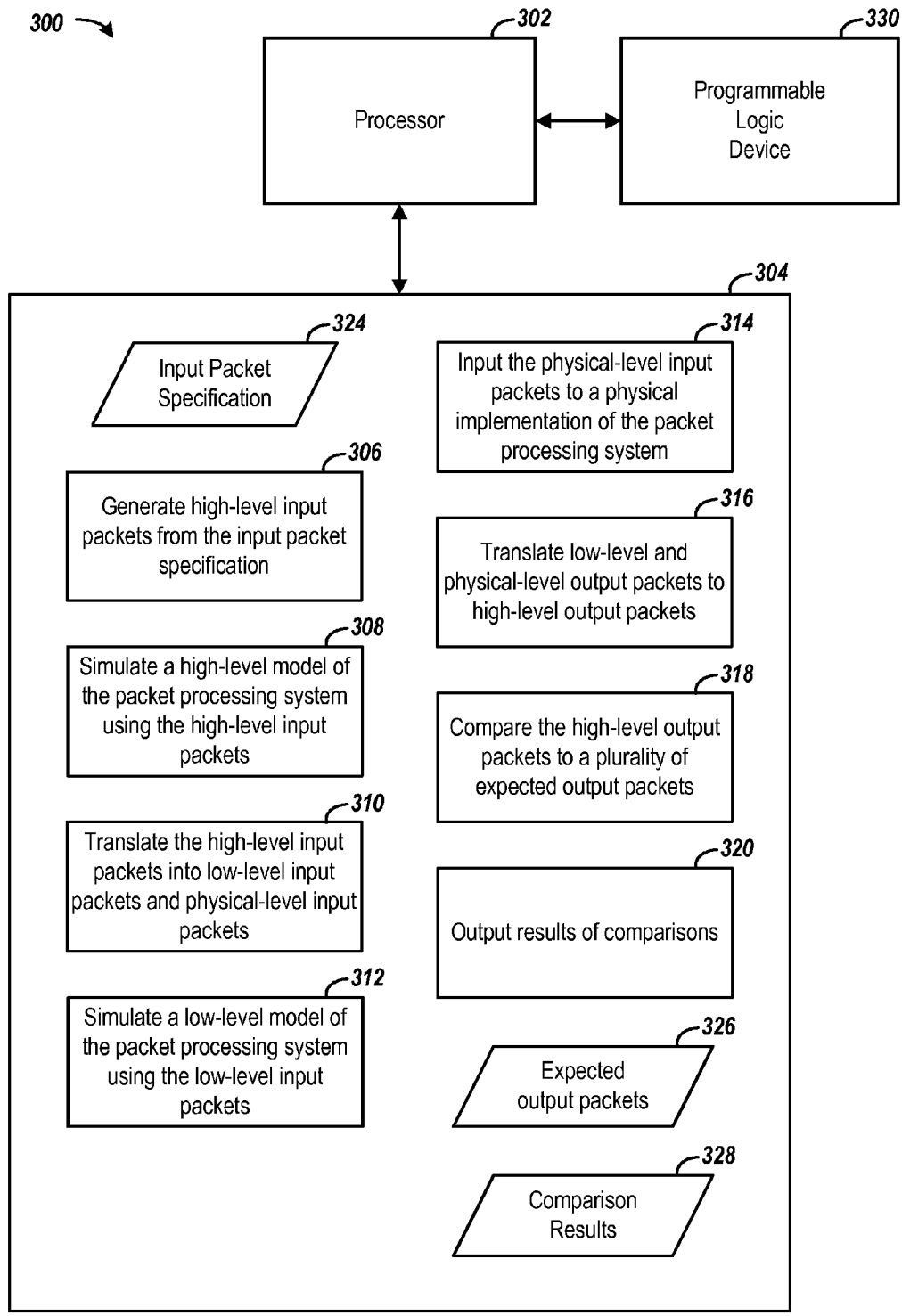
FIG. 3 is a block diagram a system for validating a circuit for processing packets of a communication protocol, in accordance with various embodiments of the invention.

FIG. 3 illustrates a block diagram of a system 300 for validating a packet processing circuit in accordance with various embodiments of the invention. Those skilled in the art will appreciate that various alternative computing arrangements, including one or more processors and a memory arrangement configured with program code, would be suitable for hosting the processes and data structures and implementing the algorithms of the different embodiments of the present invention. In addition, program code that implements the processes may be provided via a variety of computer-readable storage media or delivery channels such as magnetic or optical disks or tapes, electronic storage devices, or as application services over a network.

System 300 includes a processor arrangement 302 ("processor" for brevity) coupled to a memory/storage arrangement 304 ("memory" for brevity). The architecture of the system depends on implementation requirements, as would be recognized by those skilled in the art. The processor arrangement 302 may be one or more general purpose processors, or a combination of one or more general purpose processors and suitable co-processors, or one or more specialized processors (e.g., RISC, pipelined, etc.).

The memory/storage arrangement 304 is representative of hierarchical storage commonly found in computing arrangements. Such hierarchical storage typically includes multiple levels of cache memory, a main memory, and local and/or remote persistent storage such as provided by magnetic disks (not shown). The memory/storage arrangement may include one or both of local and remote memory/storage, remote storage being coupled to the processor arrangement via a local area network, for example.

The processor 302 executes the software stored in memory 304, and reads data from and stores data to the memory according to the processes described above. An operating system (not shown) manages the resources of the computing arrangement.

Memory 304 is configured with software modules 306, 308, 310, 312, 314, 316, 318, and 320. Execution of the instructions of these modules by the processor 302 causes the processor to validate a packet processing circuit. An input packet specification 324 specifies a packet format and formats of a plurality of fields. The packet specification also specifies a respective set of one or more possible values for each of the fields input.

Execution of the instructions of software module 306 causes the processor to generate a plurality of high-level input packets from the input packet specification, with each field of each high-level input packet having a value from the respective set. Execution of the instructions of software module 308 causes the processor to simulate a high-level model of the packet processing system, which inputs the high-level input packets and outputs a plurality of high-level output packets.

Execution of the instructions of software module 310 causes the processor to translate the high-level input packets into a plurality of low level packets and into a plurality of physical-level input packets. Execution of the instructions of software module 312 causes the processor to simulate a low-level model of the packet processing system that inputs the low-level input packets and outputs a plurality of low-level output packets. Execution of the instructions of software module 314 causes the processor to input the physical-level input packets to a physical implementation of the packet processing circuit, which outputs a plurality of physical-level output packets. The physical implementation of the packet processing circuit may be configured in a programmable integrated circuit such as a programmable logic device (PLD) 330, for example. The processor 302 is coupled to the PLD for providing the input packets and receiving output packets. Execution of the instructions of software module 316 causes the processor to translate the low-level output packets into a second plurality of high-level output packets and to translate the physical-level output packets into a third plurality of high-level output packets.

Execution of the instructions of software module 318 causes the processor to compare each of the first, second and third high-level output packets to corresponding expected output packets 326 to determine if each of the first, second and third high-level output packets are equivalent to the expected output packets. In one embodiment, the expected output packets 326 are stored on the memory 304. Execution of the instructions of software module 320 causes the processor to output the results 328 of the comparisons. In one embodiment, the outputting includes storing the results 328 of the comparisons on the memory 304.

Figure 4:
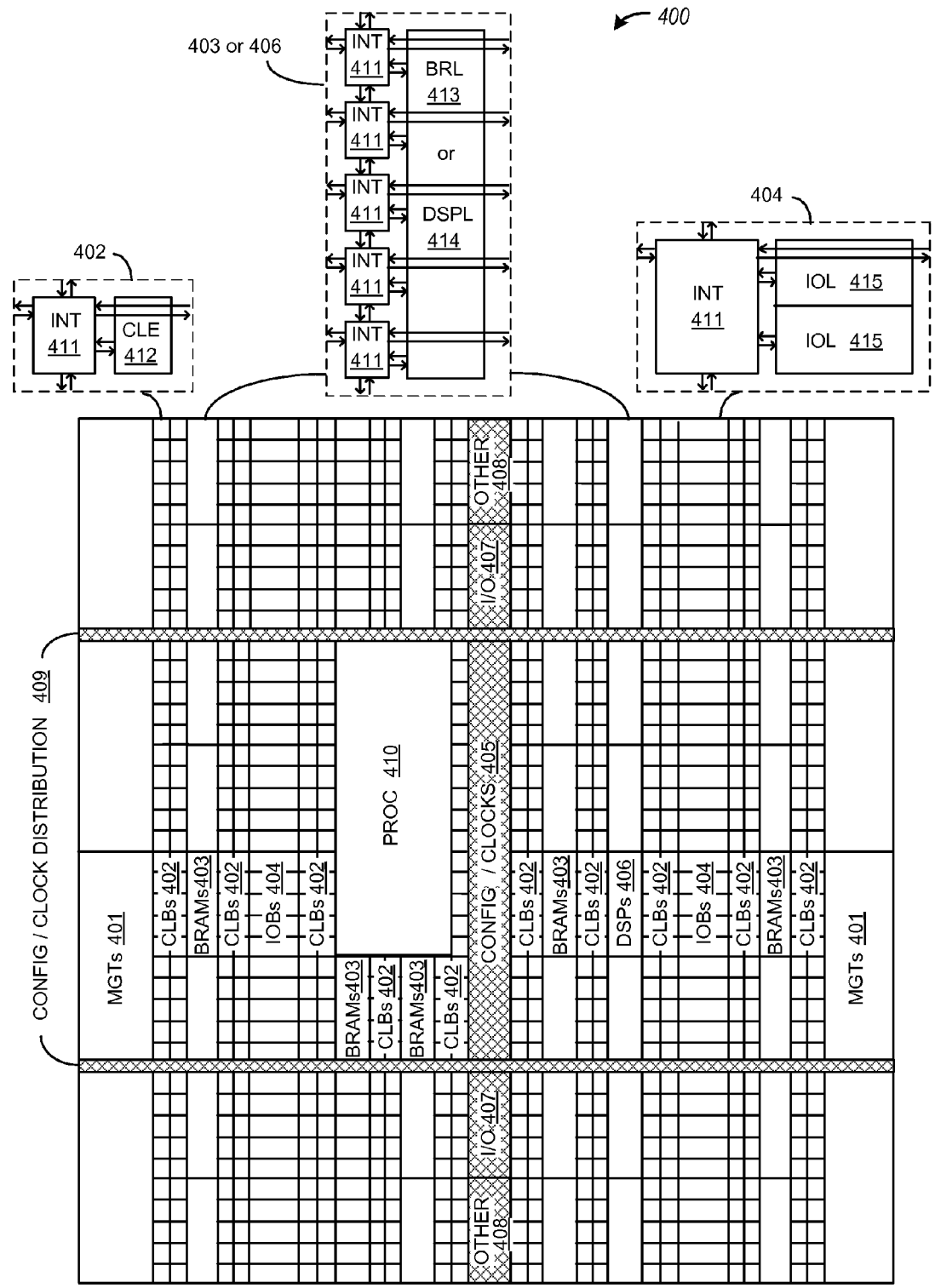
FIG. 4 is a block diagram of a programmable integrated circuit that is reconfigurable, in accordance with various embodiments of the invention.

FIG. 4 is a diagram of an example field programmable gate array (FPGA) that is reconfigurable in accordance with various embodiments of the present invention. For example, the FPGA 400 may be used to validate a physical implementation of the packet processing circuit, e.g., as element 330 of FIG. 3. The FPGA of FIG. 4 includes several different types of programmable logic blocks. Those skilled in the art will appreciate that the FPGA of FIG. 4 provides only one example of an integrated circuit device on which the methods of the present invention can be practiced.

Advanced FPGAs can include several different types of programmable logic blocks in the array. For example, FIG. 4 illustrates an FPGA architecture 400 that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

The present invention is thought to be applicable to a variety of systems for validating packet processing designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of validating a design for a packet processing circuit, comprising:
    inputting from a memory to a processor, a high-level language specification of a first format of an input packet, wherein the specification defines a plurality of fields of the input packet and a respective set of one or more possible values for each of the fields;
    generating by the processor from the input specification, a plurality of high-level input packets having the first format, wherein each field of each input packet has a value from the respective set;
    simulating the circuit using a first model of the design on the processor, wherein the first model inputs the high-level input packets and outputs a first plurality of high-level output packets;
    translating the high-level input packets into a plurality of low-level input packets by the processor;
    simulating with the processor, the circuit using a second model that inputs the low-level input packets and outputs a plurality of low-level output packets;
    translating by the processor, the low-level output packets into a second plurality of high-level output packets;
    comparing by the processor, the first plurality of high-level output packets for equivalence to corresponding expected output packets, and comparing the second plurality of high-level output packets for equivalence to the corresponding expected output packets; and
    storing by the processor in the memory, data indicative of whether or not the first plurality of high-level output packets is equivalent to the corresponding expected output packets, and whether or not the second plurality of high-level output packets is equivalent to the corresponding expected output packets.

2. The method of claim 1, further comprising:
translating by the processor, the high-level input packets into a plurality of physical-level input packets, and inputting the physical-level input packets to a physical implementation of the design, wherein the physical implementation of the design outputs a plurality of physical-level output packets;
translating by the processor, the plurality of physical-level output packets into a third plurality of high-level output packets; and
wherein the comparing includes comparing the third plurality of high-level output packets to the corresponding expected output packets.

3. The method of claim 1, wherein for at least one of the fields, the specification defines a single discrete value.

4. The method of claim 1, wherein for at least one of the fields, the specification defines a range of discrete values, and the generating includes generating for each value in the range of discrete values a respective packet having the value for the at least one of the fields.

5. The method of claim 1, wherein for at least one of the fields, the specification defines at least two alternative discrete values, and the generating includes generating for each of the alternative discrete values a respective packet having the value for the at least one of the fields.

6. The method of claim 1, wherein for at least one of the fields, the specification defines a wildcard value, and the generating includes generating respective packets for all values of the field specified with the wildcard value.

7. The method of claim 1, wherein for at least one of the fields, the specification defines a don't-care value, and the generating includes generating a packet having a random value for the field specified with the don't-care value.

8. The method of claim 1, wherein the generating of the high-level input packets includes generating a respective high-level input packet for each possible combination of values of the fields.

9. A system for validating a design for a packet processing circuit, comprising:
a processor; and
a memory coupled to the processor, wherein the memory is configured with instructions that when executed by the processor cause the processor to perform operations including:
inputting a high-level language specification of a first format of an input packet, wherein the specification defines a plurality of fields of the input packet and a respective set of one or more possible values for each of the fields;
generating from the input specification a plurality of high-level input packets having the first format, wherein each field of each input packet has a value from the respective set;
simulating the circuit using a first model of the design, wherein the first model inputs the high-level input packets and outputs a first plurality of high-level output packets;
translating the high-level input packets into a plurality of low-level input packets;
simulating the circuit using a second model that inputs the low-level input packets and outputs a plurality of low-level output packets;
translating the low-level output packets into a second plurality of high-level output packets;
comparing the first plurality of high-level output packets for equivalence to corresponding expected output packets, and comparing the second plurality of high-level output packets for equivalence to the corresponding expected output packets; and
storing data indicative of whether or not the first plurality of high-level output packets is equivalent to the corresponding expected output packets, and whether or not the second plurality of high-level output packets is equivalent to the corresponding expected output packets.

10. The system of claim 9, the operations further comprising:
translating the high-level input packets into a plurality of physical-level input packets, and inputting the physical-level input packets to a physical implementation of the design, wherein the physical implementation of the design outputs a plurality of physical-level output packets;
translating the plurality of physical-level output packets into a third plurality of high-level output packets; and
wherein the comparing includes comparing the third plurality of high-level output packets to the corresponding expected output packets.

11. The system of claim 9, wherein for at least one of the fields, the specification defines a single discrete value.

12. The system of claim 9, wherein for at least one of the fields, the specification defines a range of discrete values, and the generating includes generating for each value in the range of discrete values a respective packet having the value for the at least one of the fields.

13. The system of claim 9, wherein for at least one of the fields, the specification defines at least two alternative discrete values, and the generating includes generating for each of the alternative discrete values a respective packet having the value for the at least one of the fields.

14. The system of claim 9, wherein for at least one of the fields, the specification defines a wildcard value, and the generating includes generating respective packets for all values of the field specified with the wildcard value.

15. The system of claim 9, wherein for at least one of the fields, the specification defines a don't-care value, and the generating includes generating a packet having a random value for the field specified with the don't-care value.

16. The system of claim 9, wherein the generating of the high-level input packets includes generating a respective high-level input packet for each possible combination of values of the fields.

17. An article of manufacture, comprising:
a non-transitory storage medium configured with instructions for validating a design for a packet processing circuit, wherein the instructions when executed by one or more processors cause the processor to perform operations including:
inputting a high-level language specification of a first format of an input packet, wherein the specification defines a plurality of fields of the input packet and a respective set of one or more possible values for each of the fields;
generating from the input specification a plurality of high-level input packets having the first format, wherein each field of each input packet has a value from the respective set;
simulating the circuit using a first model of the design, wherein the first model inputs the high-level input packets and outputs a first plurality of high-level output packets;
translating the high-level input packets into a plurality of low-level input packets;

simulating the circuit using a second model that inputs the low-level input packets and outputs a plurality of low-level output packets;

translating the low-level output packets into a second plurality of high-level output packets;

comparing the first plurality of high-level output packets for equivalence to corresponding expected output packets, and comparing the second plurality of high-level output packets for equivalence to the corresponding expected output packets; and storing data indicative of whether or not the first plurality of high-level output packets is equivalent to the corresponding expected output packets, and whether or not the second plurality of high-level output packets is equivalent to the corresponding expected output packets.

18. The article of manufacture of claim 17, the operations further comprising:

translating the high-level input packets into a plurality of physical-level input packets, and inputting the physical-level input packets to a physical implementation of the design, wherein the physical implementation of the design outputs a plurality of physical-level output packets;

translating the plurality of physical-level output packets into a third plurality of high-level output packets; and wherein the comparing includes comparing the third plurality of high-level output packets to the corresponding expected output packets.

19. The article of manufacture of claim 17, wherein for at least one of the fields, the specification defines a range of discrete values, and the generating includes generating for each value in the range of discrete values a respective packet having the value for the at least one of the fields.

20. The article of manufacture of claim 17, wherein the generating of the high-level input packets includes generating a respective high-level input packet for each possible combination of values of the fields.

* * * * *